(12) United States Patent
Song

(10) Patent No.: US 12,089,376 B2
(45) Date of Patent: Sep. 10, 2024

(54) HEAT DISSIPATION DEVICE AND SERVER INCLUDING A FIXING BRACKET AND HEAT SINKS

(71) Applicant: HUAWEI TECHNOLOGIES CO., LTD., Guangdong (CN)

(72) Inventor: Guidong Song, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 189 days.

(21) Appl. No.: 17/848,520

(22) Filed: Jun. 24, 2022

(65) Prior Publication Data
US 2022/0322566 A1    Oct. 6, 2022

Related U.S. Application Data

(63) Continuation of application No. PCT/CN2020/120201, filed on Oct. 10, 2020.

(30) Foreign Application Priority Data

Dec. 27, 2019  (CN) .......................... 201911378498.4

(51) Int. Cl.
*H05K 7/20*    (2006.01)

(52) U.S. Cl.
CPC ....... *H05K 7/20772* (2013.01); *H05K 7/2049* (2013.01)

(58) Field of Classification Search
CPC .. H05K 7/20772; H05K 7/2039–20518; H01L 23/34–4735
See application file for complete search history.

(56) References Cited

U.S. PATENT DOCUMENTS

| | | | |
|---|---|---|---|
| 10,492,335 B1 * | 11/2019 | Hung ...................... | H01L 23/36 |
| 10,591,964 B1 * | 3/2020 | Mikjaniec .............. | H05K 7/208 |
| 2008/0137286 A1 * | 6/2008 | Fan ......................... | G06F 1/184 |
| | | | 361/679.54 |

(Continued)

FOREIGN PATENT DOCUMENTS

| | | |
|---|---|---|
| CN | 201422224 Y | 3/2010 |
| CN | 102449759 A | 5/2012 |
| CN | 205611131 U | 9/2016 |

(Continued)

OTHER PUBLICATIONS

International Search Report and Written Opinion issued in PCT/CN2020/120201, dated Jan. 20, 2021, 10 pages.

*Primary Examiner* — Zachary Pape

(57) ABSTRACT

A heat dissipation device includes a fixing bracket and a plurality of heat sinks, where the fixing bracket includes a mounting part, and a plurality of first mounting holes are provided on the mounting part; and a fixing part is disposed on each of the plurality of heat sinks, and the fixing part is inserted into the first mounting hole. A height of the fixing part above a surface of the heat sink along a direction perpendicular to the heat sink is greater than a thickness of the fixing bracket, and the fixing part fits a gap of the first mounting hole. Floating gaps are reserved for the heat sink both in a mounting direction between the heat sink and the fixing bracket and in an aperture direction of the first mounting hole, so as to reduce a risk of a damage to a chip that is not fastened with the heat sink.

11 Claims, 4 Drawing Sheets

(56) References Cited

U.S. PATENT DOCUMENTS

2016/0097602 A1    4/2016  Rice et al.
2018/0235069 A1*   8/2018  Trotman ................. H01L 23/42

FOREIGN PATENT DOCUMENTS

| CN | 106887419 A      |   | 6/2017 |
|----|------------------|---|--------|
| CN | 105472942 B      | * | 7/2018 |
| JP | 3264780 B2       | * | 3/2002 |
| WO | WO-2021088654 A1 | * | 5/2021 |

* cited by examiner

HEAT DISSIPATION DEVICE AND SERVER INCLUDING A FIXING BRACKET AND HEAT SINKS

CROSS-REFERENCE TO RELATED APPLICATIONS

This application is a continuation of International Application No. PCT/CN2020/120201, filed on Oct. 10, 2020, which claims priority to Chinese Patent Application No. 201911378498.4, filed on Dec. 27, 2019. The disclosures of the aforementioned applications are hereby incorporated by reference in their entireties.

TECHNICAL FIELD

This application relates to the field of heat dissipation, and in particular, to a heat dissipation device and a server.

BACKGROUND

In the era of the Internet, big data, and cloud computing, higher requirements are raised for transmission and processing speeds, a storage capability, and a high-performance computing capability for massive data. A chip of a server generates a large amount of heat in a process of performing intensive computing, and the chip is overheated. As a result, a processing capability of the chip is reduced or even the chip is damaged.

To implement heat dissipation of the chip, a heat sink is usually disposed on the chip. In an existing heat sink mounting manner in the industry, two heat sinks are rigidly connected and mounted as one group. This can only meet simultaneous mounting of the two heat sinks. As product functions become more powerful, currently eight chips on a board usually need heat dissipation. If the existing mounting manner is used, four groups of heat sinks need to be mounted on the board, because each heat sink dissipates heat for one chip. Consequently, mounting costs are relatively high. If four heat sinks are mounted as one group, only two groups of heat sinks need to be mounted. This doubles mounting efficiency and reduces the costs by 50%.

However, the four heat sinks in this heat sink group are rigidly connected. When dissipating heat for chips, the heat sink group needs to be abutted against chip surfaces by using a fastener. In this way, in a process of mounting and removing the heat sink group, a tolerance may cause an overall tilt of the heat sink group, and consequently, a relatively large local instantaneous force is applied to some chips, causing a damage to a chip; or there is poor contact between the heat sink and the chip, causing a failure of heat dissipation.

SUMMARY

This application provides a heat dissipation device and a server, so as to reduce a risk of chip damage and implement effective heat dissipation for the chip.

According to a first aspect, an embodiment of this application provides a heat dissipation device, where the heat dissipation device includes a fixing bracket and a plurality of heat sinks, a mounting part is disposed on the fixing bracket, and the mounting part is configured to fasten the heat sinks. A quantity of heat sinks in the heat dissipation device may be set based on a quantity of to-be-heat-dissipated chips, for example, may be 2, 3, 4, or more. Specifically, when the plurality of heat sinks are disposed on the fixing bracket, the plurality of heat sinks are separately disposed on two sides of the mounting part of the fixing bracket, and a fixing part is disposed on each heat sink. To fasten the heat sinks to the mounting part, a first mounting hole may be provided on the mounting part. In this way, the fixing part of the heat sink may be inserted into the first mounting hole, and a connection between the heat sink and the mounting part can be implemented by using a fastener that is locked onto the fixing part. In addition, a height of the fixing part above a surface of the heat sink along a direction perpendicular to the heat sink is greater than a thickness of the fixing bracket, and the fixing part fits a gap of the first mounting hole.

According to the heat dissipation device in this embodiment, the plurality of heat sinks are connected by using the fixing bracket, so that there is no direct interconnection relationship between the heat sinks. In addition, by making the height of the fixing part along the direction perpendicular to each of the plurality of heat sinks greater than the thickness of the fixing bracket, and making the fixing part fit the gap of the first mounting hole, after the heat sink is fastened to the fixing bracket in this way, specific floating gaps may be reserved for the heat sink both in a mounting direction between the heat sink and the fixing bracket and in a direction perpendicular to the foregoing mounting direction. Therefore, when the heat dissipation device is being mounted on the to-be-heat-dissipated chip, and when each heat sink is being fastened, another heat sink may be effectively prevented from being driven to move, so as to implement independent mounting of each heat sink. This reduces a risk that system tolerances existing in the heat dissipation device causes a chip to be broken or damaged. In addition, by using the heat dissipation device in this application, the plurality of heat sinks may be simultaneously removed or mounted, so as to help improve mounting efficiency of the heat dissipation device and reduce mounting costs.

In a possible implementation of this application, specifically, when the fixing part is disposed, a difference between a height of the fixing part along a direction perpendicular to each heat sink and a thickness of the mounting part of the fixing bracket may be selected based on the system tolerances of the heat dissipation device such as a design tolerance and an assembly tolerance. For example, the difference may be in a range from 1 mm to 2 mm. In this way, the heat sink is enabled to move in the mounting direction between the heat sink and the fixing bracket.

In a possible implementation of this application, a handle may be further disposed on the fixing bracket, and the handle may be fixedly connected to the mounting part, so as to help lift the heat dissipation device. In addition, there may be two handles, so that when there is a relatively large quantity of heat sinks fastened to the fixing bracket, the heat dissipation device can be easily lifted with both hands for ease of operation.

In a possible implementation of this application, the handle and the mounting part may further form an integrated molding structure, to help simplify a structure of the fixing bracket.

According to a second aspect, an embodiment of this application further provides a server, where the server includes a chip and the heat dissipation device according to any one of possible implementations of the first aspect, and each heat sink of the heat dissipation device is configured to dissipate heat for the chip.

According to the heat dissipation device in the server in this embodiment, the plurality of heat sinks are connected by using the fixing bracket, and the floating gaps are reserved in each direction between the fixing bracket and the heat sink, so that there is no direct interconnection relationship between the heat sinks. Therefore, when the heat dissipation device is being mounted on the server, and when one of the heat sinks is being fastened, another heat sink may be effectively prevented from being driven to move, so as to implement independent mounting of each heat sink. This avoids damages to a chip that is not mounted with the heat sink.

In a possible implementation of this application, the server may further include a chassis. Both the chip and the heat dissipation device are disposed in the chassis, and the heat sink of the heat dissipation device is in contact with the chip in a one-to-one correspondence. Because the plurality of heat sinks in the heat dissipation device may be connected by using the fixing bracket, when the chassis includes a plurality of to-be-heat-dissipated chips, the plurality of heat sinks may be simultaneously removed or mounted by using the heat dissipation device in this application, so as to help improve mounting efficiency of the heat dissipation device and reduce mounting costs.

In a possible implementation of this application, a guide structure may be further disposed on a peripheral side of the chip, and a second mounting hole is further provided on the heat sink. In this way, when each heat sink is disposed on a corresponding chip, a guiding function of mounting the heat sink can be implemented by making the guide structure pass through the second mounting hole in a one-to-one correspondence, so as to correct an assembly position of the heat sink and the chip.

In a possible implementation of this application, a board handle may be further disposed on the server, one end of the board handle is fastened to the chassis, and the other end is fastened to the fixing bracket. The fixing bracket is fastened to the chassis by using the board handle. In this way, vibration of the fixing bracket may be avoided in a process of transporting and handling the server, so that beating on the heat sink by the fixing bracket may be avoided. This avoids a problem of non-uniform force applied to the chip.

In addition, specifically, when the fixing bracket is connected to the board handle, a connection part may be disposed on the fixing bracket. When the fixing bracket has a handle, the connection part may be disposed at an end that is of the handle and that is away from the mounting part. In this case, a connection between the board handle and the connection part can implement fastening between the fixing bracket and the chassis. An acting force applied to the connection part by the board handle may be a pressing force or a pulling force, provided that a relative position between the fixing bracket and the chassis can be fastened.

REFERENCE NUMERALS

1: fixing bracket; 101: mounting part; 1011: first mounting hole; 1012: gap; 102: handle; 103: connection part;
2: heat sink; 201: quick connector; 202: water pipe; 203: fixing part; 204: second mounting hole; 205: gasket;
3: chassis; 301: guide structure; 302: spring screw; 303: board handle; 4: chip.

DESCRIPTION OF EMBODIMENTS

To facilitate understanding of the heat dissipation device provided in this embodiment, the following first describes an application scenario of the heat dissipation device provided in this embodiment. The heat dissipation device may be configured to dissipate heat for a server that has high power and generates a relatively large amount of heat, and mainly dissipate heat for a server chip. The server chip may be a bare die or a non-bare die, but is not limited to the foregoing two types. A chip that needs to be protected by a protection cover is referred to as a non-bare die, and a chip that does not need to be protected by a protection cover is referred to as a bare die. In addition, the server chip may be but is not limited to a central processing unit (CPU), an artificial intelligence (AI), a system on chip (SoC), and another chip that has high power and needs separate heat dissipation. The following describes the heat dissipation device in detail with reference to accompanying drawings.

Figure 1:
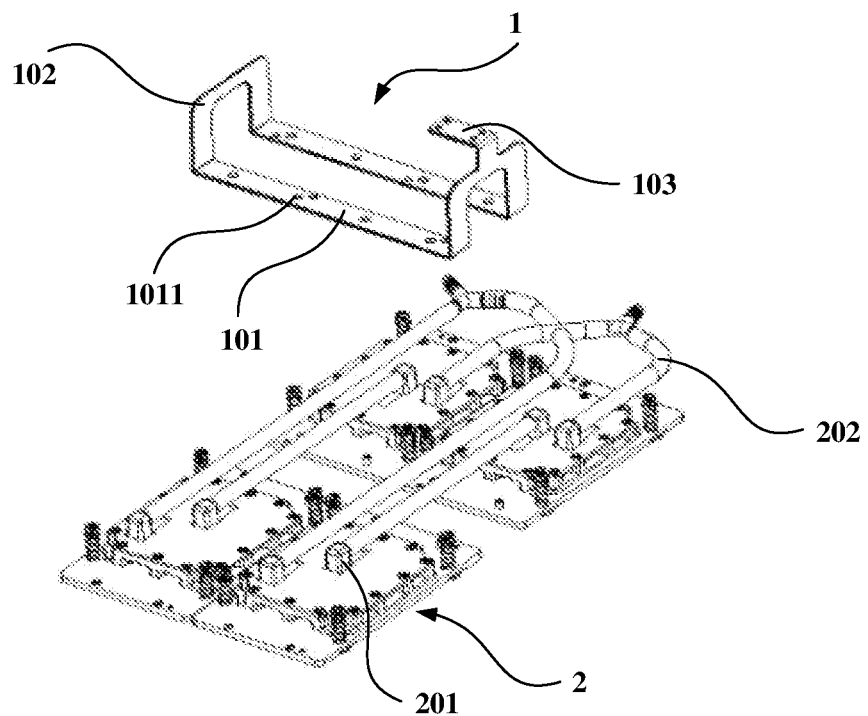
FIG. 1 is an exploded view of a heat dissipation device according to an embodiment of this application.
Figure 2:
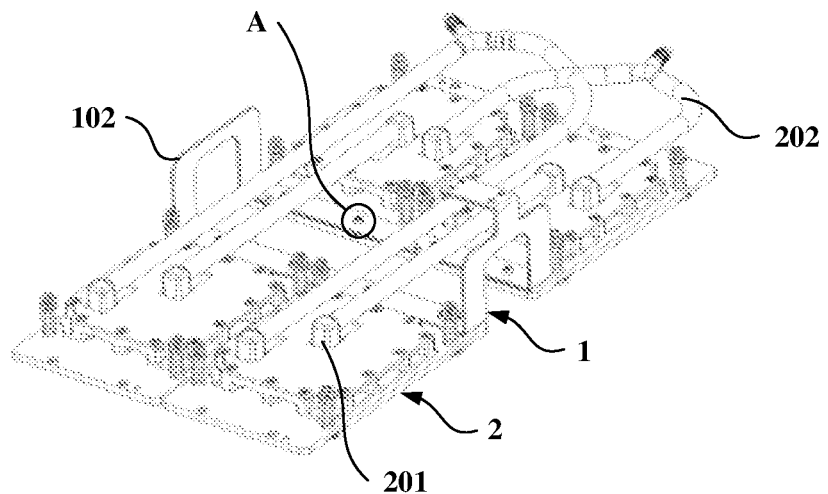
FIG. 2 is a schematic diagram of a structure of a heat dissipation device according to an embodiment of this application.

Referring to FIG. 1, an embodiment of this application provides a heat dissipation device. The heat dissipation device includes a fixing bracket 1 and a plurality of heat sinks 2. Referring to FIG. 2 together, the plurality of heat sinks 2 are separately disposed on two sides of the fixing bracket 1 and connected to the fixing bracket 1. Each of the plurality of heat sinks 2 may be a water-cooled heat sink, an air-cooled heat sink, or another possible type of heat sink. Regardless of a type of the heat sink 2, manners of disposing the heat sink 2 in the heat dissipation device are similar. Therefore, in each embodiment of this application, that the heat sink 2 is a water-cooled heat sink may be used as an example to describe the heat dissipation device.

Still referring to FIG. 1, specifically, when the fixing bracket 1 is disposed, the fixing bracket 1 includes a mounting part 101 configured to mount the plurality of heat sinks 2. A plurality of first mounting holes 1011 are provided on the mounting part 101, and the plurality of first mounting holes 1011 are spaced apart from each other. A specific spacing between the first mounting holes 1011 may be adjusted based on a spacing of the heat sinks 2 disposed on a same side of the fixing bracket 1. Specifically, when the mounting part 101 of the fixing bracket 1 is disposed, the mounting part 101 may be two oppositely disposed strip-shaped structures, so as to help simplify a structure of the fixing bracket 1. This reduces a weight and a volume of the fixing bracket 1. In addition, a material of the fixing bracket 1 may be copper, aluminum, or the like, or may be a metal with relatively high strength such as steel, so as to avoid relatively large deformation during use.

To help lift the fixing bracket 1, the fixing bracket 1 may further include a handle 102, and the handle 102 is disposed at an end of the mounting part 101 of the fixing bracket 1. Referring to FIG. 1, there may be two handles 102, which are respectively disposed at two opposite ends of the mounting part 101, so that a user can lift the heat dissipation device with both hands for ease of operation when a relatively large quantity of heat sinks 2 are mounted on the mounting part 101. A specific shape of the handle 102 may be but is not limited to a U shape, helping the user hold the handle. In addition, the handle 102 and the mounting part 101 may form an integrated molding structure. In a possible embodiment, when a fixing bracket is specifically formed, referring to FIG. 1, an end of an annular structure may be bent to form a bent edge as the handle 102, and the remaining part is used as the mounting part 101 to be connected to the heat sink 2.

Referring to FIG. 2, specifically, when the plurality of heat sinks 2 are disposed, a quantity of heat sinks 2 may be selected based on a quantity of chips that need heat dissipation, for example, may be 2, 3, 4, or more. For example, when heat dissipation is to be performed on eight chips, four heat sinks 2 may be included in each heat dissipation device, so that heat dissipation requirements of the eight chips can be met by using two heat dissipation devices. In addition, a layout manner of the plurality of heat sinks 2 may be consistent with a layout manner of to-be-heat-dissipated chips, so that one heat sink 2 is disposed corresponding to each chip. In this way, heat dissipation for each chip is implemented. Referring to FIG. 2, when the heat dissipation device includes four heat sinks 2 and the heat sinks 2 are water-cooled heat sinks 2, the four heat sinks 2 may be connected to each other by using four pairs of quick connectors 201 and four water pipes 202.

Figure 3:
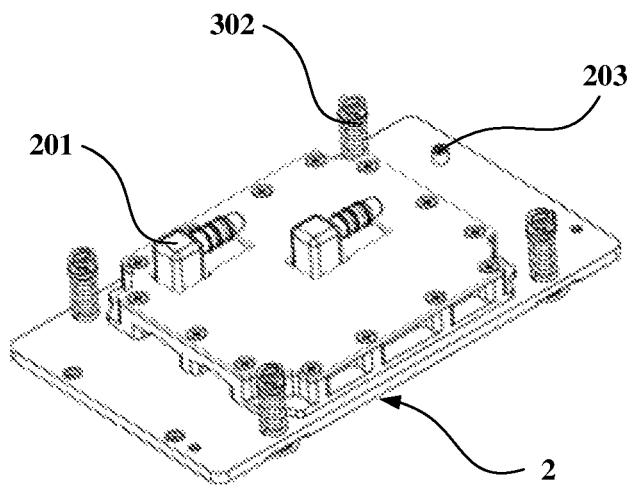
FIG. 3 is a schematic diagram of a structure of a heat sink according to an embodiment of this application.

FIG. 3 is a schematic diagram of a structure of a heat sink 2 according to an embodiment of this application. A fixing part 203 may be further disposed on each heat sink 2, and the fixing part 203 may be disposed in a one-to-one correspondence with the first mounting hole 1011 on the mounting part 101 of the fixing bracket 1 in FIG. 1. In addition, a tapped hole (not shown in the figure) may be further provided on the fixing part 203.

Figure 4:
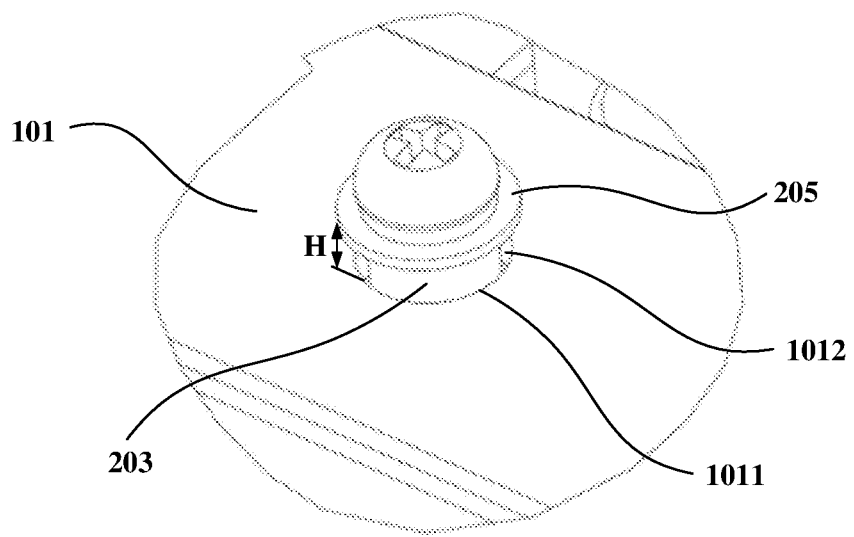
FIG. 4 is an enlarged view of a local structure at a position A in FIG. 2.

When the plurality of heat sinks 2 are disposed on the fixing bracket 1, first, referring to FIG. 1 and FIG. 3 together, the plurality of heat sinks 2 may be classified into two groups based on a layout requirement, and the two groups of heat sinks 2 are disposed in a manner in which sides with fixing parts 203 are disposed oppositely. Then, the fixing part 203 of the heat sink 2 is extended into the first mounting hole 1011 corresponding to the mounting part 101 of the fixing bracket 1. Referring to FIG. 4, an end of the fixing part 203 is exposed from the first mounting hole 1011, and a height H between the exposed part and an end face on a side that is of the mounting part 101 and that is away from the heat sink 2 may be set based on system tolerances (such as a machining tolerance and an assembling tolerance) of the heat dissipation device. For example, the height H may be in a range from 1 mm to 2 mm. In addition, the fixing part 203 fits a gap of the first mounting hole 1011, and the gap 1012 may be set based on the system tolerances of the heat dissipation device. For example, the gap 1012 may be 0.5 mm, so that the fixing bracket 1 and the heat sink 2 are easily assembled, and may be prevented from getting stuck. Finally, a fastener such as a screw may be fastened to the tapped hole of the fixing part 203 to implement a connection between the fixing bracket 1 and the heat sink 2. Because there is a gap between a hole wall of the first mounting hole 1011 and the fixing part 203, a fastener whose screw cap is far larger than the first mounting hole 1011 may be selected to avoid a connection failure between the mounting part 101 of the fixing bracket 1 and the fixing part 203. Alternatively, as shown in FIG. 4, a gasket 205 is disposed between the screw cap of the fastener and the mounting part 101 of the fixing bracket 1, and an outer ring diameter of the gasket 205 is made far larger than a diameter of the first mounting hole 1011.

In the heat dissipation device in this application, the fixing part 203 of the heat sink 2 is enabled to be exposed from an end face of the mounting part 101 of the fixing bracket 1, and a gap is reserved between the fixing part 203 and the first mounting hole 1011 of the mounting part 101. In this way, specific floating gaps may be reserved for the heat sink 2 both in a mounting direction between the heat sink 2 and the fixing bracket 1 and in a direction perpendicular to the foregoing mounting direction. In addition, in this embodiment, the plurality of heat sinks 2 are connected by using the fixing bracket 1, so that there is no direct interconnection relationship between the heat sinks 2. Therefore, when the heat dissipation device is being mounted on the to-be-heat-dissipated chip 4, and when each heat sink 2 is being fastened, another heat sink 2 may be effectively prevented from being driven to move, so as to implement independent mounting of each heat sink 2. This reduces a risk that the system tolerances existing in the heat dissipation device cause a chip 4 to be broken or damaged. In addition, by using the heat dissipation device in this application, the plurality of heat sinks 2 may be simultaneously removed or mounted, so as to help improve mounting efficiency of the heat dissipation device and reduce mounting costs.

Figure 5:
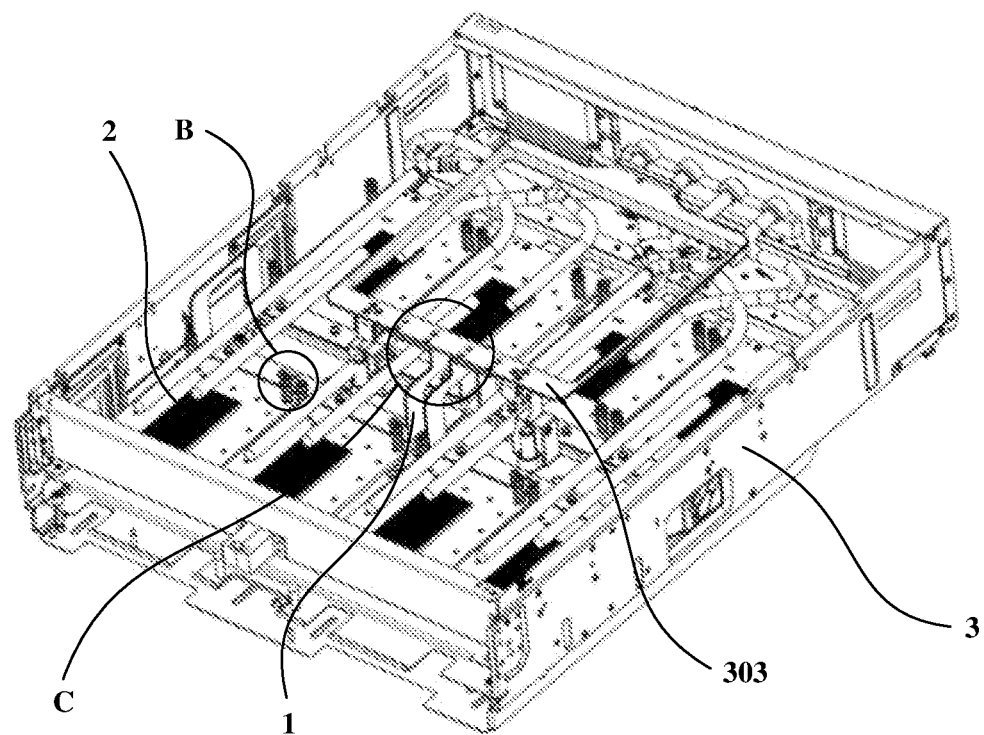
FIG. 5 is a schematic diagram of a structure of a server according to an embodiment of this application.

In addition, referring to FIG. 5, an embodiment of this application further provides a server. The server includes a chassis 3, a chip 4 (refer to FIG. 6) disposed in the chassis 3, and the heat dissipation device in the foregoing embodiment. The heat dissipation component of the heat dissipation device is configured to dissipate heat for the chip 4. For ease of description, referring to FIG. 6, a quantity of chips 4 in the server may be set to 8, and each heat dissipation device includes four heat sinks 2. In this way, two heat dissipation devices are disposed in the server, so that a heat dissipation requirement for each chip 4 can be met. Therefore, mounting efficiency of the heat dissipation device is relatively high.

Before the heat dissipation device is disposed in the chassis 3 of the server, referring to FIG. 2, a plurality of heat sinks 2 are connected to a fixing bracket 1. Referring to FIG. 1 and FIG. 3 together, an end of a fixing part 203 of the heat sink 2 is exposed from a first mounting hole 1011 on the mounting part 101 of the fixing bracket 1, and a height between the exposed part and the end face of the side of the mounting part 101 away from the heat sink 2 may be set based on system tolerances (such as a machining tolerance and an assembling tolerance) of the heat dissipation device, for example, may be in a range from 1 mm to 2 mm. In addition, the fixing part 203 fits a gap of the first mounting hole 1011, and the gap may be set based on the system tolerances of the heat dissipation device. For example, the gap may be 0.5 mm.

Figure 6:
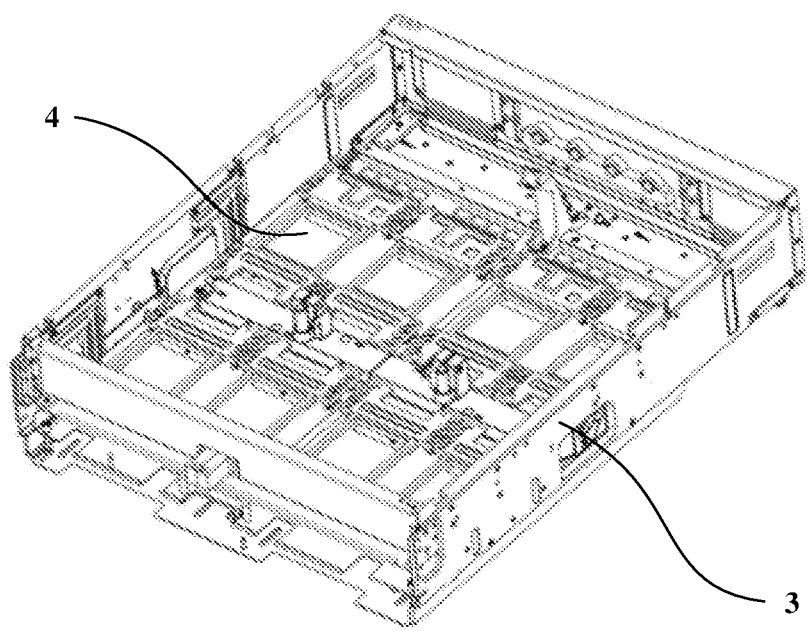
FIG. 6 is a schematic diagram of a structure of a chassis according to an embodiment of this application.

When the assembled heat dissipation device shown in FIG. 2 is disposed in the chassis 3, referring to FIG. 2 and FIG. 6 together, the user may lift the heat dissipation device by holding a handle 102 on the fixing bracket 1. After the heat sink 2 is aligned in a one-to-one correspondence with the corresponding chip 4, the heat dissipation device may be placed in the chassis 3, and the heat sink 2 is in contact with the chip 4.

Figure 7:
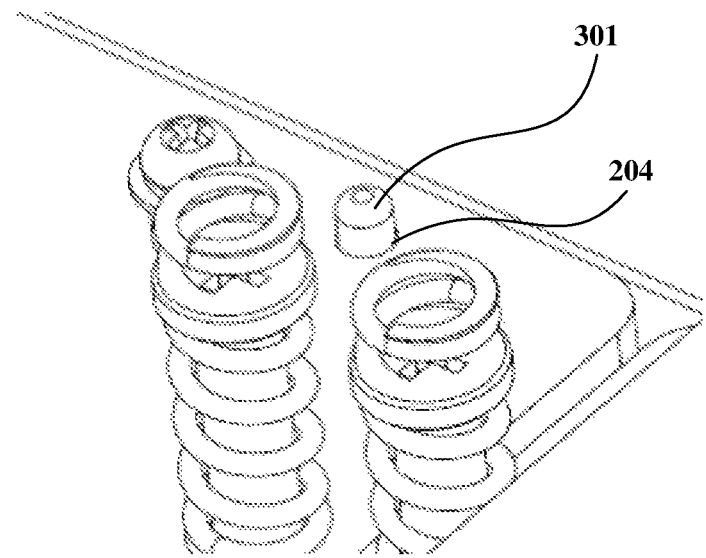
FIG. 7 is a schematic diagram of a local structure at a position B in FIG. 5.

Specifically, when the chassis 3 is disposed, a guide structure 301 (not shown in FIG. 6; refer to FIG. 7) may be further disposed on a peripheral side of each chip 4 in the chassis 3, and the guide structure 301 may be but is not limited to a guide pin. In addition, a second mounting hole 204 corresponding to the foregoing guide structure 301 is provided on each heat sink 2 in the heat dissipation device. In this way, when the heat dissipation device is assembled in the chassis 3, the guide pin may pass through the second mounting hole 204, so as to correct a mounting position of each heat sink 2, so that each heat sink 2 can be in contact with a corresponding chip 4 face to face.

Referring to FIG. 5 and FIG. 6, to fasten the heat dissipation device to the chassis 3, a third mounting hole (not shown in the figures) may be further provided on a peripheral side of each chip 4 in the chassis 3, and a fourth mounting hole (not shown in the figures) is provided on each heat sink 2 of the heat dissipation device, and the fourth mounting hole is provided in a one-to-one correspondence with the third mounting hole. In this way, a fastener such as a screw may successively pass through the fourth mounting hole and the third mounting hole to fasten the heat sink 2 to the chassis 3. The third mounting hole may be provided as a tapped hole, and a spring screw 302 (a screw housed by a spring) shown in FIG. 3 may be selected as the fastener used to fasten the heat sink 2. A quantity of the fasteners may be two or more even numbers, so as to improve uniformity of force applied to the chip 4. Selecting the spring screw 302 as the fastener may help prevent the spring screw 302 from applying a relatively large local instantaneous force to the chip 4 in a process of fastening the spring screw 302. This avoids a damage to the chip 4.

In the server in this embodiment, each heat dissipation device may include a plurality of heat sinks 2. In this way, the plurality of heat sinks 2 may be simultaneously removed or mounted. In an application scenario in which there is a relatively large quantity of to-be-heat-dissipated chips 4 in the server, using the heat dissipation device may help improve mounting efficiency of the heat dissipation device and reduce mounting costs. In addition, the fixing part 203 of the heat sink 2 of the heat dissipation device is enabled to be exposed from an end face of the mounting part 101 of the fixing bracket 1, and the fixing part 203 is enabled to fit a gap of the first mounting hole 1011 of the mounting part 101. In this way, specific floating gaps may be reserved for the heat sink 2 both in a mounting direction between the heat sink 2 and the fixing bracket 1 and in a direction perpendicular to the foregoing mounting direction. In addition, in this embodiment, the plurality of heat sinks 2 are connected by using the fixing bracket 1, so that there is no direct interconnection relationship between the heat sinks 2. Therefore, when the heat dissipation device is being mounted on the to-be-heat-dissipated chip 4, and when each heat sink 2 is being fastened, another heat sink 2 may be effectively prevented from being driven to move, so as to implement independent mounting of each heat sink 2. This reduces a risk that the system tolerances existing in the heat dissipation device cause a chip 4 to be broken or damaged.

In addition, in this embodiment, after each heat sink 2 of the heat dissipation device is fastened to the chassis 3, a connection relationship between the fixing bracket 1 and the heat sink 2 may be further cancelled by loosening fasteners used to fasten the fixing bracket 1 and the heat sink 2, so that the fixing bracket 1 is removed from the chassis 3. This avoids increasing a weight of the entire server.

Referring to FIG. 5, in some embodiments of this application, the fixing bracket 1 may be alternatively left in the chassis 3. However, because there is a gap between the fixing bracket 1 and the heat sink 2, vibration of the fixing bracket 1 is generated in a process of transporting and handling the server, and the vibration of the fixing bracket 1 may cause the fixing bracket 1 to beat the heat sink 2. In addition, because the heat sink 2 is in contact with the chip, a beating force of the fixing bracket 1 on the heat sink 2 is transferred to the chip, causing non-uniform force applied to the chip. To resolve the foregoing problem, the fixing bracket 1 may be fastened to the chassis 3.

Figure 8:
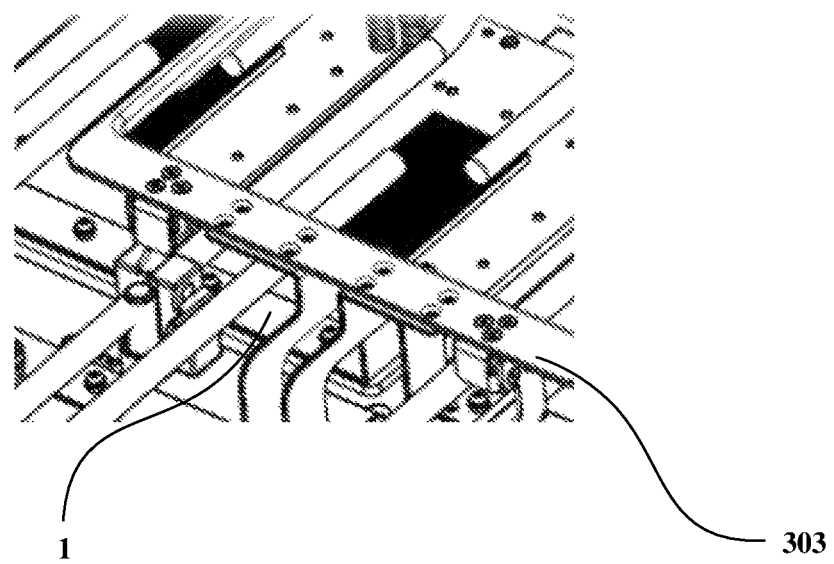
FIG. 8 is a schematic diagram of a local structure at a position C in FIG. 5.

There may be a plurality of manners of fastening the fixing bracket 1 to the chassis 3. For example, the fixing part may be locked by using a fastener. For details, refer to FIG. 5 and FIG. 8. FIG. 8 is a partially enlarged view at a position C in FIG. 5. A board handle 303 may be further disposed in the chassis 3. One end of the board handle 303 is fastened to the chassis 3, and the other end extends to an upper part of the fixing bracket 1 of the heat dissipation device (in the present disclosure, the upper part of the fixing bracket 1 refers to a side that is of the fixing bracket 1 and that is away from the heat sink 2). To help fasten the fixing bracket 1 to the board handle 303, referring to FIG. 1, a connection part 103 may be further disposed on the handle 102 of the fixing bracket 1, and the connection part 103 is fixedly connected to the board handle 303. A connection manner between the connection part 103 and the board handle 303 may be but is not limited to a welding or fastening connection. In addition, an acting force applied to the connection part 103 by the board handle 303 may be a pulling force or a pressing force, provided that a relative position relationship between the fixing bracket 1 and the chassis 3 can remain unchanged.

In the server in this embodiment, each heat sink 2 in the heat dissipation device may be in contact with a corresponding chip 4, so that the chip 4 can have a good heat dissipation characteristic. In addition, the plurality of heat sinks 2 are connected by using the fixing bracket 1, and the floating gaps are reserved in each direction between the fixing bracket 1 and the heat sink 2, so that there is no direct interconnection relationship between the heat sinks 2. Therefore, when the heat dissipation device is being mounted on the to-be-heat-dissipated chip 4, and when each heat sink 2 is being fastened, another heat sink 2 may be effectively prevented from being driven to move, so as to implement independent mounting of each heat sink 2. This avoids a damage to a chip 4 that is not mounted with the heat sink 2.

The foregoing descriptions are merely non-limiting examples of specific implementations and are not intended to limit the protection scope, which is intended to cover any variation or replacement readily determined by a person of ordinary skill in the art. Therefore, the claims shall define the protection scope.

What is claimed is:

1. A heat dissipation device, comprising a fixing bracket and a plurality of heat sinks, wherein
the fixing bracket comprises a mounting part, and a plurality of first mounting holes are provided on the mounting part; and
a fixing part is disposed on each of the plurality of heat sinks, and the fixing parts disposed on the plurality of heat sinks are inserted into the plurality of first mounting holes,
wherein, for each of the fixed parts, the fixed part is disposed on its corresponding heat sink and inserted into its corresponding first mounting hole, a height of the fixing part above a surface of the corresponding heat sink along a direction perpendicular to the corresponding heat sink is greater than a thickness of the fixing bracket, the fixing part fits a gap of the corresponding first mounting hole, and a difference between the height of the fixing part above the surface of the corresponding heat sink along the direction perpendicular to the corresponding heat sink and a thickness of the mounting part is in a range from 1 mm to 2 mm.

2. The heat dissipation device according to claim 1, wherein the fixing bracket further comprises a handle, and the handle is fixedly connected to the mounting part.

3. The heat dissipation device according to claim 2, wherein the mounting part comprises two handles respectively disposed at two ends of the mounting part.

4. The heat dissipation device according to claim 2, wherein the fixing bracket is an integrated molding structure.

5. The heat dissipation device according to claim 1, wherein the heat dissipation device comprises four or more heat sinks.

6. The heat dissipation device according to claim 1, wherein the plurality of heat sinks is separately disposed on two sides of the fixing bracket.

7. A server, comprising at least one chip and a heat dissipation device comprising a fixing bracket and a plurality of heat sinks, wherein the plurality of heat sinks of the heat dissipation device is configured to dissipate heat for one the at least one chip,
wherein
the fixing bracket comprises a mounting part, and a plurality of first mounting holes are provided on the mounting part; and
a fixing part is disposed on each of the plurality of heat sinks, and the fixing parts disposed on the plurality of heat sinks are inserted into the plurality of first mounting holes,
wherein, for each of the fixed parts, the fixed part is disposed on its corresponding heat sink and inserted into its corresponding first mounting hole, a height of the fixing part above a surface of the corresponding heat sink along a direction perpendicular to the corresponding heat sink is greater than a thickness of the fixing bracket, the fixing part fits a gap of the corresponding first mounting hole, and a difference between the height of the fixing part above the surface of the corresponding heat sink along the direction perpendicular to the corresponding heat sink and a thickness of the mounting part is in a range from 1 mm to 2 mm.

8. The server according to claim 7, wherein the server further comprises a chassis, the at least one chip and the heat dissipation device are fastened to the chassis, and a heat sink of the plurality of heat sinks is in contact with one of the at least one chip.

9. The server according to claim 7, wherein a guide structure is further disposed on a peripheral side of the one of the at least one chip, a second mounting hole is further provided on a heat sink of the plurality of heat sinks, and the guide structure passes through the second mounting hole.

10. A server, comprising at least one chip and a heat dissipation device comprising a fixing bracket and a plurality of heat sinks, wherein the plurality of heat sinks of the heat dissipation device is configured to dissipate heat for one of the at least one chip,
wherein
the fixing bracket comprises a mounting part, and a plurality of first mounting holes are provided on the mounting part; and
a fixing part is disposed on each of the plurality of heat sinks, and the fixing parts disposed on the plurality of heat sinks are inserted into the plurality of first mounting holes,
wherein, for each of the fixed parts, the fixed part is disposed on its corresponding heat sink and inserted into its corresponding first mounting hole, a height of the fixing part above a surface of the corresponding heat sink along a direction perpendicular to the corresponding heat sink is greater than a thickness of the fixing bracket, and the fixing part fits a gap of the corresponding first mounting hole,
wherein the server further comprises a chassis, the at least one chip and the heat dissipation device are fastened to the chassis, and a heat sink of the plurality of heat sinks is in contact with one of the at least one chip,
wherein a board handle is further disposed on the server, one end of the board handle is fastened to the chassis, and the other end of the board handle is fastened to the fixing bracket.

11. The server according to claim 10, wherein the fixing bracket further comprises a handle disposed on the mounting part and a connection part, the connection part is disposed at an end of the handle, the end of the handle is away from the mounting part, and the board handle is fixedly connected to the connection part.

* * * * *